US012569957B2

(12) United States Patent (10) Patent No.: US 12,569,957 B2

Ota et al. (45) Date of Patent: Mar. 10, 2026

(54) SUBSTRATE PROCESSING APPARATUS AND SUBSTRATE PROCESSING METHOD

(71) Applicant: EBARA CORPORATION, Tokyo (JP)

(72) Inventors: Kohei Ota, Tokyo (JP); Nobuyuki Takada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 244 days.

(21) Appl. No.: 18/257,898

(22) PCT Filed: Nov. 9, 2021

(86) PCT No.: PCT/JP2021/041139

§ 371 (c)(1),
(2) Date: Jun. 16, 2023

(87) PCT Pub. No.: WO2022/149346

PCT Pub. Date: Jul. 14, 2022

(65) Prior Publication Data

US 2024/0051080 A1 Feb. 15, 2024

(30) Foreign Application Priority Data

Jan. 8, 2021 (JP) ................................. 2021-002158

(51) Int. Cl.
B24B 37/10 (2012.01)
B24B 37/04 (2012.01)
H01L 21/306 (2006.01)

(52) U.S. Cl.
CPC .......... B24B 37/107 (2013.01); B24B 37/042 (2013.01); H01L 21/30625 (2013.01)

(58) Field of Classification Search
None
See application file for complete search history.

(56) References Cited

U.S. PATENT DOCUMENTS 6,692,338 B1* 2/2004 Kirchner ................. B24B 37/26
451/60
7,300,340 B1* 11/2007 Elmufdi .................. B24B 37/26
451/527

(Continued)

FOREIGN PATENT DOCUMENTS

CN 111584355 A 8/2020
JP H10-015823 A 1/1998

(Continued)

OTHER PUBLICATIONS

Machine Generated English Translation of the Bib of JPH1015823A published Jan. 20, 1998 (Year: 1998).*

(Continued)

*Primary Examiner* — Sylvia Macarthur
(74) *Attorney, Agent, or Firm* — Chrisman Gallo Tochtrop LLC

(57) ABSTRACT

To suppress damage to a surface to be polished of a substrate and improve a polishing rate. A substrate processing apparatus includes a table 100 for supporting a substrate WF, a pad holder 226 for holding a polishing pad 222 for polishing the substrate WF supported by the table 100, a nozzle 228 for supplying a polishing liquid around the pad holder 226, and a pad rotation mechanism for rotating the pad holder 226. The pad holder 226 includes a discharge hole 221-2a formed in the center of a holding surface 221-2c configured to hold the polishing pad 222 and a discharge passage 221-2b communicated with an outside of the pad holder 226 from the discharge hole 221-2a.

9 Claims, 9 Drawing Sheets

(56)  References Cited

U.S. PATENT DOCUMENTS

| | | | | |
|---|---|---|---|---|
| 8,002,611 | B2 * | 8/2011 | He | B24B 37/26 |
| | | | | 451/550 |
| 9,339,914 | B2 * | 5/2016 | Yavelberg | B24B 37/34 |
| 9,870,933 | B2 * | 1/2018 | Engesser | H01L 21/67248 |
| 10,854,469 | B2 * | 12/2020 | Hinode | H01L 21/6708 |
| 2001/0010305 | A1 * | 8/2001 | Takahashi | B24B 37/04 |
| | | | | 156/345.48 |
| 2007/0151867 | A1 | 7/2007 | Hu et al. | |
| 2007/0153453 | A1 | 7/2007 | Wang et al. | |
| 2017/0047237 | A1 | 2/2017 | Kobata et al. | |
| 2020/0243364 | A1 | 7/2020 | Kobata et al. | |
| 2022/0375775 | A1 | 11/2022 | Kobata et al. | |
| 2024/0051080 | A1 * | 2/2024 | Ota | B24B 37/00 |

FOREIGN PATENT DOCUMENTS

| | | | | |
|---|---|---|---|---|
| JP | 2000-158331 | A | 6/2000 | |
| JP | 5919592 | B1 | 5/2016 | |
| TW | 200733219 | A | 9/2007 | |
| WO | WO-2006003697 | A1 * | 1/2006 | B24B 37/26 |

OTHER PUBLICATIONS

Machine Generated English Translation of the description of JPH1015823A published Jan. 20, 1998 (Year: 1998).*
Machine Generated English Translation of the claims of JPH1015823A published Jan. 20, 1998 (Year: 1998).*
International Search Report issued in Patent Application No. PCT/JP2021/041139 dated Jan. 11, 2022.

\* cited by examiner

1000

SUBSTRATE PROCESSING APPARATUS AND SUBSTRATE PROCESSING METHOD

TECHNICAL FIELD

This application relates to a substrate processing apparatus and a substrate processing method. This application claims priority from Japanese Patent Application No. 2021-2158 filed on Jan. 8, 2021. The entire disclosure including the descriptions, the claims, the drawings, and the abstracts in Japanese Patent Application No. 2021-2158 is herein incorporated by reference.

BACKGROUND ART

There is a Chemical Mechanical Polishing (CMP) apparatus as one kind of a substrate processing apparatus used for a semiconductor processing process. The CMP apparatus can be roughly classified into "a face-up type (a system in which a surface to be polished of a substrate faces upward)" and "a face-down type (a system in which a surface to be polished of a substrate faces downward)" depending on a direction that the surface to be polished of the substrate faces.

PTL 1 discloses a face-up type polishing apparatus that polishes a substrate by bringing a polishing pad having a diameter smaller than that of the substrate into contact with the substrate while rotating the polishing pad. The polishing apparatus has a circulation path radially formed from the center of a polishing tool for holding the polishing pad, and is configured to supply a polishing liquid supplied to the center of the polishing tool to the substrate from the outer periphery of the polishing tool. Further, the polishing apparatus is configured such that the polishing liquid supplied from the outer periphery of the polishing tool to the substrate is recovered at the center of the polishing tool by a spiral groove formed on the polishing pad.

CITATION LIST

Patent Literature

PTL 1: Japanese Patent No. 5919592

SUMMARY OF INVENTION

Technical Problem

However, the technique described in PTL 1 does not consider suppressing damage to the surface to be polished of the substrate or improvement in polishing rate.

That is, since the polishing tool is a rotating component, it is necessary to dispose a rotary joint (or a component having a function equivalent to that of the rotary joint: hereinafter simply referred to as the rotary joint) in order to supply the polishing liquid through the polishing tool. When the polishing liquid passes through the rotary joint, abrasive grains contained in the polishing liquid might abrade components inside the rotary joint, and particles resulting from the abrasion might enter between the polishing pad and the substrate together with the polishing liquid, damaging the surface to be polished of the substrate.

On the other hand, when the polishing liquid is not supplied via the polishing tool, it is difficult to sufficiently supply the polishing liquid between the polishing surface of the polishing pad and the surface to be polished of the substrate. In this respect, as described in PTL 1, the polishing liquid can be circulated by using the polishing pad having a spiral groove and by forming the circulation path in the polishing tool. However, since the method disclosed in PTL 1 circulates the polishing liquid via the polishing tool, it cannot necessarily supply the fresh polishing liquid between the polishing tool and the substrate. Therefore, in the method of PTL 1, the fresh polishing liquid cannot be sufficiently supplied to the center of the surface to be polished of the substrate, and the polishing rate might be decreased. Further, when the polishing liquid is circulated and used, residues generated during polishing of the substrate might damage the surface to be polished of the substrate.

Therefore, an object of this application is to suppress damage to the surface to be polished of the substrate and improve the polishing rate.

Solution to Problem

According to one embodiment, a substrate processing apparatus is disclosed, and the substrate processing apparatus includes: a table for supporting a substrate; a pad holder for holding a polishing pad for polishing the substrate supported by the table; a nozzle for supplying a polishing liquid around the pad holder; and a pad rotation mechanism for rotating the pad holder. The pad holder includes: a discharge hole formed in a center of a holding surface configured to hold the polishing pad; and a discharge passage communicated with an outside of the pad holder from the discharge hole.

DESCRIPTION OF EMBODIMENTS

Figure 1:
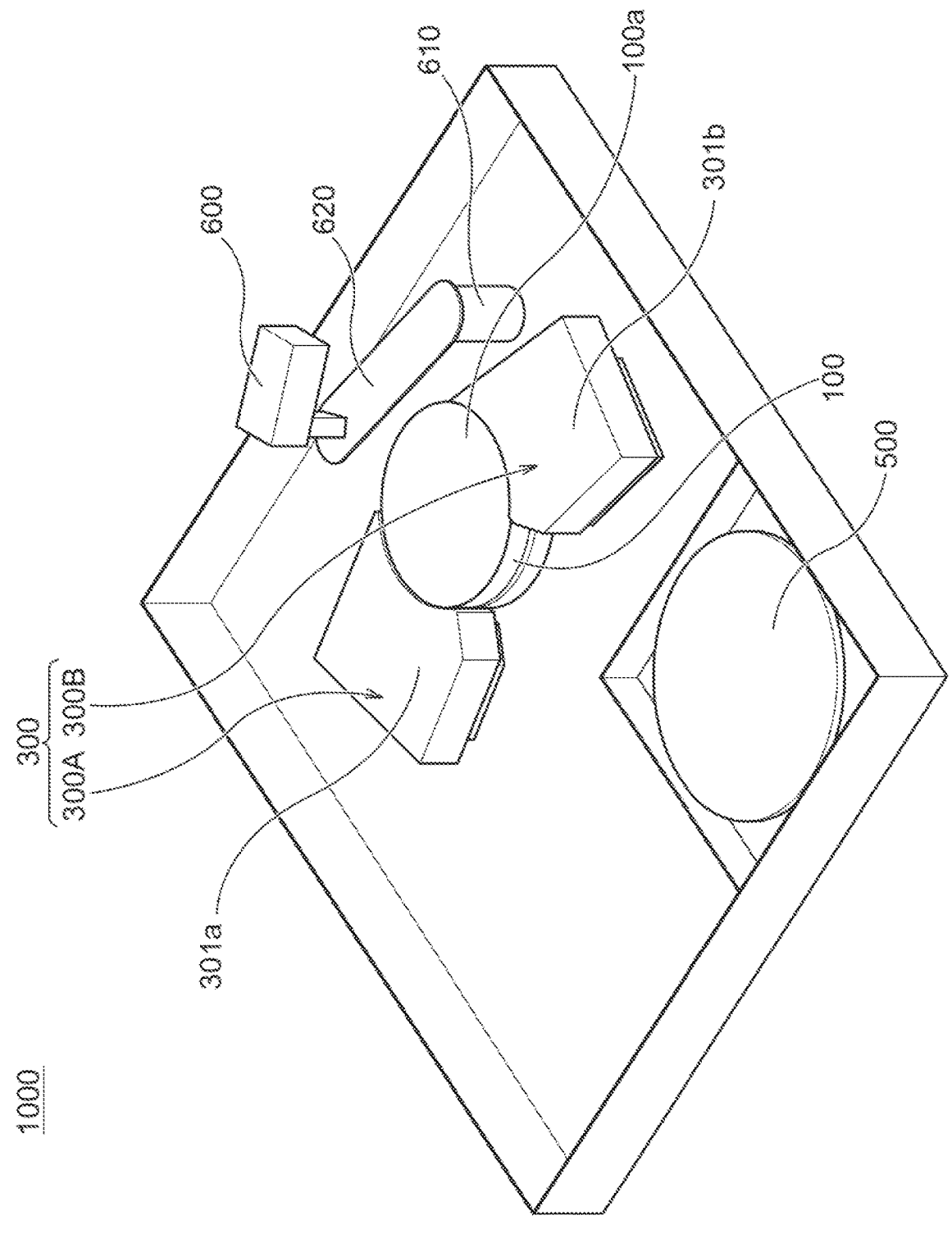
FIG. 1 is a perspective view schematically illustrating an overall configuration of a substrate processing apparatus according to one embodiment.

The following describes embodiments of a substrate processing apparatus and a substrate processing method according to the present invention with reference to the attached drawings. In the attached drawings, identical or similar reference numerals are attached to identical or similar components, and overlapping description regarding the identical or similar components may be omitted in the description of the respective embodiments. Features illustrated in the respective embodiments are applicable to other embodiments in so far as they are consistent with one another.

Figure 2:
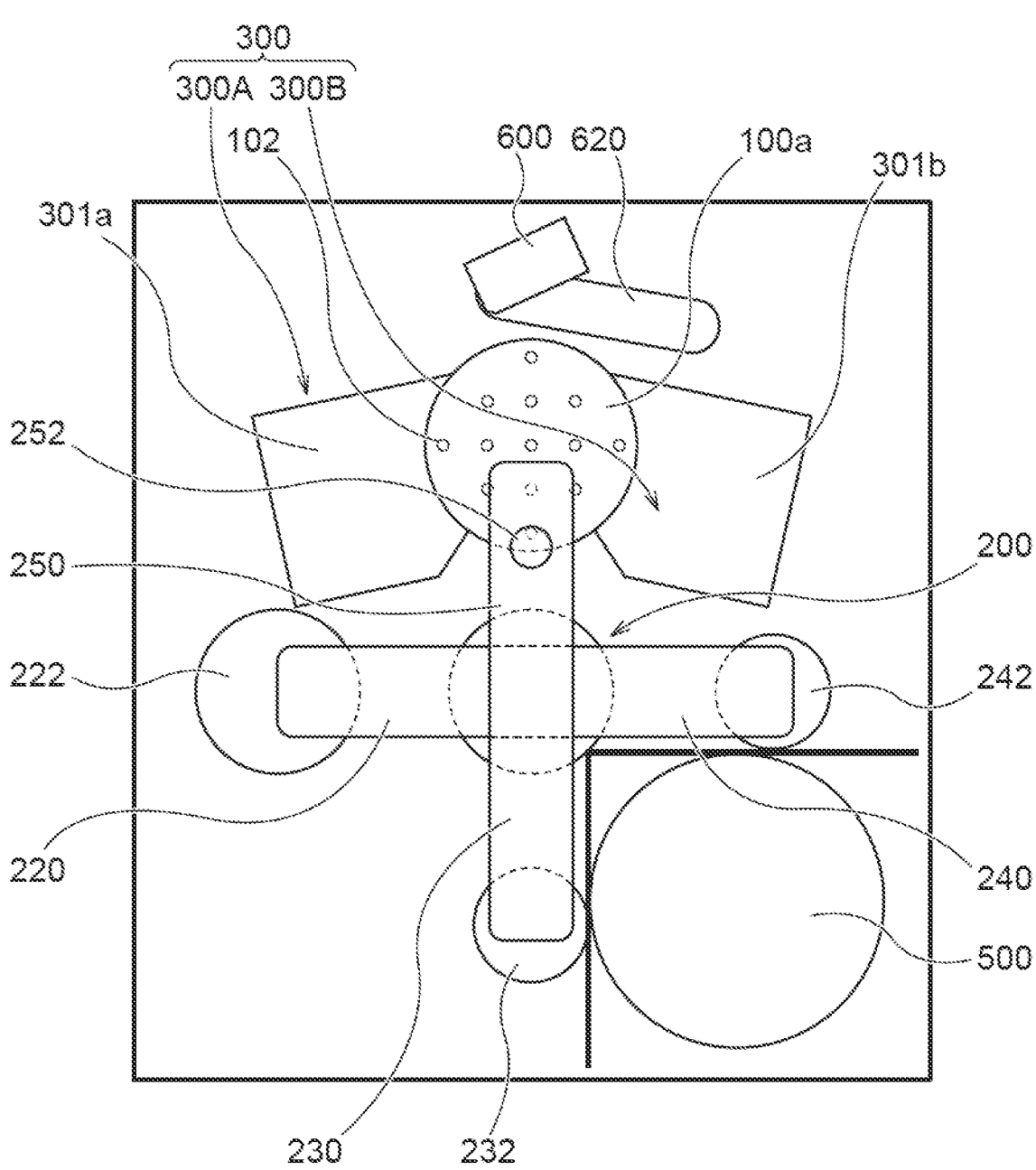
FIG. 2 is a plan view schematically illustrating the overall configuration of the substrate processing apparatus according to one embodiment.

FIG. 1 is a perspective view schematically illustrating an overall configuration of the substrate processing apparatus according to one embodiment. FIG. 2 is a plan view schematically illustrating the overall configuration of the substrate processing apparatus according to one embodiment. A substrate processing apparatus 1000 illustrated in FIG. 1 and FIG. 2 includes a table 100, a multi-axis arm 200, supporting members 300A, 300B, a dresser 500, and a film thickness measuring instrument (end point detector) 600. In FIG. 1, the multi-axis arm 200 is omitted for clarification of illustration.

<Table>

The table 100 is a member for supporting a substrate WF such that a surface to be polished of the substrate WF as a process target faces upward in the vertical direction. In one embodiment, the table 100 includes a support surface 100a for supporting a back surface opposite to the surface to be polished of the substrate WF and is configured to be rotatable by a driving mechanism, such as a motor (not illustrated). The support surface 100a has a plurality of holes 102, and the table 100 is configured to be capable of performing vacuum suction on the substrate WF via the holes 102. The substrate processing apparatus 1000 of this embodiment is a face-up type substrate processing apparatus that polishes the substrate WF with the surface to be polished of the substrate WF facing upward.

<Multi-Axis Arm>

Figure 3:
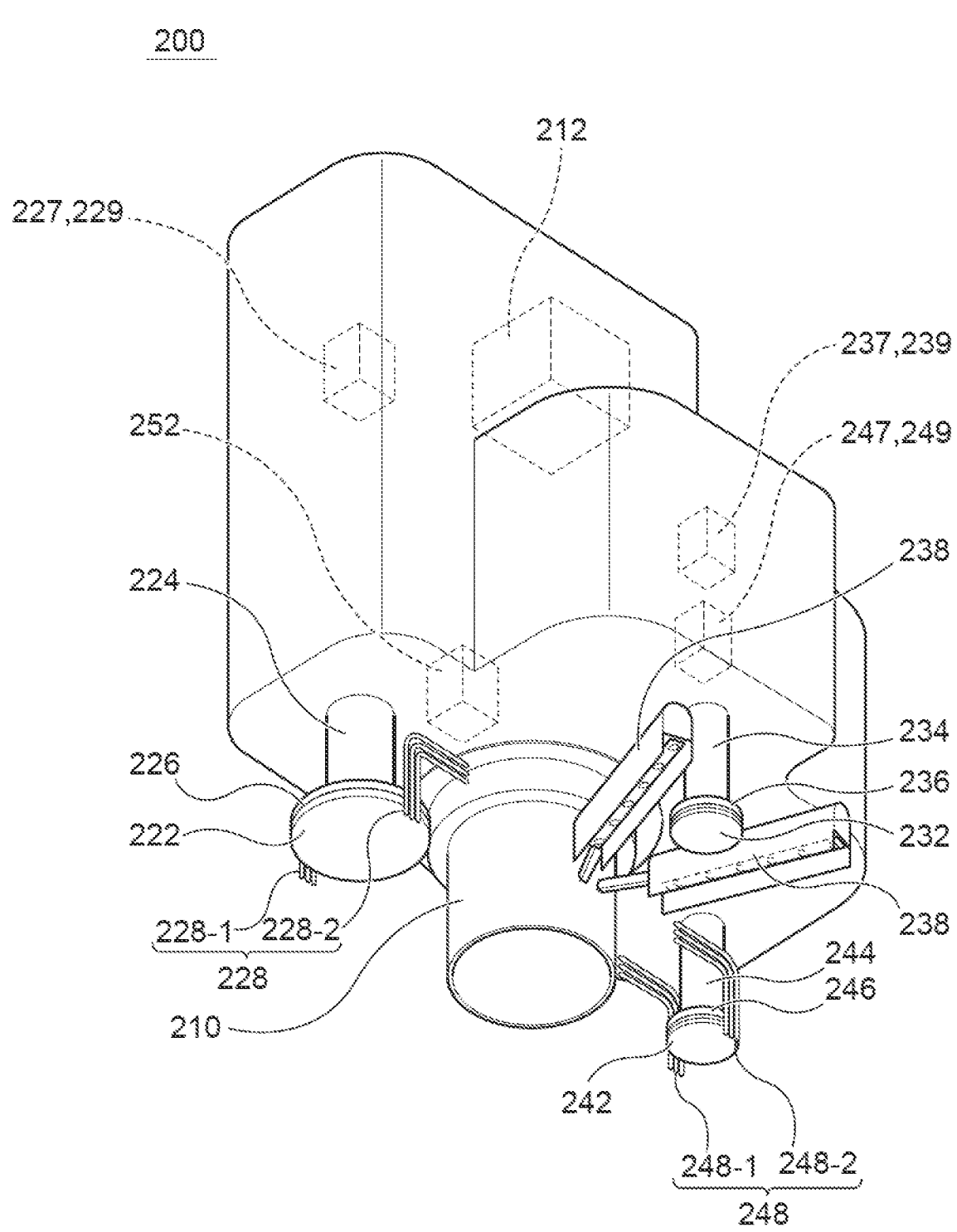
FIG. 3 is a perspective view schematically illustrating a multi-axis arm according to one embodiment.

FIG. 3 is a perspective view schematically illustrating the multi-axis arm according to one embodiment. As illustrated in FIG. 2 and FIG. 3, the multi-axis arm 200 is a member that holds a plurality of processing tools for performing various processes on the substrate WF supported by the table 100 and is arranged adjacent to the table 100. The multi-axis arm 200 in this embodiment is configured to hold a large-diameter polishing pad 222 for polishing the substrate WF, a cleaning tool 232 for cleaning the substrate WF, a small-diameter polishing pad 242 for finish polishing the substrate WF, and a photographing member (camera) 252 for measuring a diameter of the substrate WF.

The multi-axis arm 200 includes: a swing shaft 210 extending in a direction perpendicular to the substrate WF (height direction); a rotation drive mechanism 212, such as a motor, that rotatably drives the swing shaft 210; and a first arm 220, a second arm 230, a third arm 240, and a fourth arm 250, which are supported by the swing shaft 210 and radially arranged around the swing shaft 210.

To the first arm 220, a rotation shaft 224 that extends in the height direction is mounted, and to a distal end of the rotation shaft 224, a pad holder 226 is mounted. The large-diameter polishing pad 222 is held to the pad holder 226. The multi-axis arm 200 includes an elevating mechanism 227 for moving up and down the pad holder 226 with respect to the substrate WF. For example, the elevating mechanism 227 can be achieved by a known mechanism, such as an air cylinder. The multi-axis arm 200 includes a pad rotation mechanism 229 for rotating the pad holder 226. For example, the pad rotation mechanism 229 can be achieved by a known mechanism, such as a motor, and can rotate the pad holder 226 by rotating the rotation shaft 224.

The multi-axis arm 200 includes nozzles 228 arranged around the pad holder 226. The nozzles 228 are configured to supply a polishing liquid (slurry) to the substrate WF. The nozzles 228 include a first nozzle 228-1 arranged on a swing path of the pad holder 226 and a second nozzle 228-2 arranged on a swing path of the pad holder 226 on a side opposite to the first nozzle 228-1 across the pad holder 226. The first nozzle 228-1 and the second nozzle 228-2 are each configured to supply the polishing liquid to the surface to be polished of the substrate WF.

To the second arm 230, a rotation shaft 234 that extends in the height direction is mounted, and to a distal end of the rotation shaft 234, a cleaning tool holder 236 is mounted. The cleaning tool 232 is held to the cleaning tool holder 236. The multi-axis arm 200 includes an elevating mechanism 237 for moving up and down the cleaning tool holder 236 with respect to the substrate WF. For example, the elevating mechanism 237 can be achieved by a known mechanism, such as an air cylinder. The multi-axis arm 200 includes a cleaning tool rotation mechanism 239 for rotating the cleaning tool holder 236. For example, the cleaning tool rotation mechanism 239 can be achieved by a known mechanism, such as a motor, and can rotate the cleaning tool holder 236 by rotating the rotation shaft 234.

The multi-axis arm 200 includes atomizers 238 for supplying a cleaning liquid around the cleaning tool holder 236. The atomizers 238 are disposed on both sides in the swinging direction of the cleaning tool holder 236 across the cleaning tool holder 236, and are configured to discharge the cleaning liquid to the substrate WF.

To the third arm 240, a rotation shaft 244 that extends in the height direction is mounted, and to a distal end of the rotation shaft 244, a pad holder 246 is mounted. The small-diameter polishing pad 242 is held to the pad holder 246. The multi-axis arm 200 includes an elevating mechanism 247 for moving up and down the pad holder 246 with respect to the substrate WF. For example, the elevating mechanism 247 can be achieved by a known mechanism, such as an air cylinder. The multi-axis arm 200 includes a pad rotation mechanism 249 for rotating the pad holder 246. For example, the pad rotation mechanism 249 can be achieved by a known mechanism, such as a motor, and can rotate the pad holder 246 by rotating the rotation shaft 244. To the fourth arm 250, the photographing member 252 is held.

The multi-axis arm 200 includes nozzles 248 for supplying the polishing liquid around the pad holder 246. The nozzles 248 include a first nozzle 248-1 arranged on a swing path of the pad holder 246 and a second nozzle 248-2 arranged on a swing path of the pad holder 246 on a side opposite to the first nozzle 248-1 across the pad holder 246. The first nozzle 248-1 and the second nozzle 248-2 are configured to supply the polishing liquid to the surface to be polished of the substrate WF.

As illustrated in FIG. 2, in this embodiment, the first arm 220, the second arm 230, the third arm 240, and the fourth arm 250 radially extend around the swing shaft 210 while being displaced counterclockwise by 90 degrees in plan view. Rotatably driving the swing shaft 210 by the rotation drive mechanism 212 allows moving any of the large-diameter polishing pad 222, the cleaning tool 232, the small-diameter polishing pad 242, and the photographing member 252 onto the substrate WF. Rotatably driving the swing shaft 210 by the rotation drive mechanism 212 allows moving the polishing pad 222 or the polishing pad 242 onto the dresser 500. The rotation drive mechanism 212 has a function of a swing mechanism that rotatably drives the swing shaft 210 clockwise and counterclockwise in alternation to swing the first arm 220, the second arm 230, the third arm 240, and the fourth arm 250. Specifically, the rotation drive mechanism 212 rotatably drives the swing shaft 210 clockwise and counterclockwise in alternation in a state where the polishing pad 222, the cleaning tool 232, or the polishing pad 242 are positioned on the substrate WF to allow the polishing pad 222 (the pad holder 226), the cleaning tool 232 (the cleaning tool holder 236), or the polishing pad 242 (the pad holder 246) to swing with respect to the substrate WF. While this embodiment shows an example in which the polishing pad 222, the cleaning tool 232, or the polishing pad 242 is turned and swung in the radial direction of the substrate WF, that is, moved in a reciprocating manner along an arc by the rotation drive mechanism 212, the configuration is not limited to this. For example, the swing mechanism can have a configuration that linearly swings the polishing pad 222, the cleaning tool 232, or the polishing pad 242 in the radial direction of the substrate, that is, moves it in a reciprocating manner along a straight line.

For example, in a case where the polishing pad 222 is on the substrate WF, the substrate processing apparatus 1000 is configured to rotate the table 100 and rotate the polishing pad 222, and swing the polishing pad 222 by the rotation drive mechanism 212 while pressing the polishing pad 222 against the substrate WF by the elevating mechanism 227 to polish the substrate WF.

<Supporting Members>

As illustrated in FIG. 1 and FIG. 2, the substrate processing apparatus 1000 includes a first supporting member 300A arranged on a swing path of the polishing pad 222 outside the table 100 and a second supporting member 300B arranged on a swing path of the polishing pad 222 on a side opposite to the first supporting member 300A across the table 100. The first supporting member 300A and the second supporting member 300B are linearly symmetrical across the substrate WF. In view of this, the following will collectively describe the first supporting member 300A and the second supporting member 300B as supporting members 300, accordingly. While the following will give a description on the function of the supporting members 300 in a case where the large-diameter polishing pad 222 is swung with respect to the substrate WF as an example, the same applies to the cleaning tool 232 or the small-diameter polishing pad 242.

The supporting members 300 are members for supporting the polishing pad 222 swung to the outside of the table 100 by the rotation of the swing shaft 210. That is, the substrate processing apparatus 1000 is configured to swing (overhang) the polishing pad 222 until the polishing pad 222 projects to outside of the substrate WF when polishing the substrate WF to uniformly polish the surface to be polished of the substrate WF. Here, in a case where the polishing pad 222 is overhung, due to various factors, such as an inclination of the pad holder 226, a pressure of the polishing pad 222 concentrates on a periphery edge portion of the substrate WF, and the surface to be polished of the substrate WF may possibly fail to be uniformly polished. Therefore, the substrate processing apparatus 1000 in this embodiment includes the supporting members 300 for supporting the polishing pad 222 overhung to the outside of the substrate WF on both sides of the table 100.

The first supporting member 300A and the second supporting member 300B respectively include support surfaces 301a, 301b that can support an entire polishing surface 222c of the polishing pad 222 in contact with the substrate WF. That is, the support surfaces 301a, 301b each have an area larger than an area of the polishing surface 222c of the polishing pad 222, and therefore even when the polishing pad 222 completely overhangs to the outside of the substrate WF, the entire polishing surface 222c is supported by the support surfaces 301a, 301b. Thus, in this embodiment, when the polishing pad 222 swings on the substrate WF, the entire polishing surface of the polishing pad 222 is in contact with the substrate WF while being supported, and when the polishing pad 222 swings up to the outside of the table 100, the entire polishing surface is supported by the supporting members 300. Accordingly, the polishing pad 222 does not protrude from the surface to be polished of the substrate WF or the regions of the support surfaces 301a, 301b during swinging.

<Film Thickness Measuring Instrument>

As illustrated in FIG. 1 and FIG. 2, the substrate processing apparatus 1000 includes the film thickness measuring instrument 600 for measuring a film thickness profile of the surface to be polished of the substrate WF while polishing the substrate WF. The film thickness measuring instrument 600 can be configured of various sensors, such as an eddy current sensor or an optical sensor. As illustrated in FIG. 1, a rotation shaft 610 that extends in the height direction is arranged adjacent to the table 100. The rotation shaft 610 is rotatable about an axis of the rotation shaft 610 by a rotation drive mechanism, such as a motor (not illustrated). The rotation shaft 610 includes a swing arm 620, and the film thickness measuring instrument 600 is mounted on a distal end of the swing arm 620. The film thickness measuring instrument 600 is configured to pivotally swing about the axis of the rotation shaft 610 by the rotation of the rotation shaft 610. Specifically, the film thickness measuring instrument 600 can swing along the radial direction of the substrate WF by the rotation of the rotation shaft 610 during polishing of the substrate WF. The film thickness measuring instrument 600 is configured to swing to a position moved away from above the substrate WF while the polishing pad 222 is swinging above the substrate WF, and to swing above the substrate WF while the polishing pad 222 is not swinging above the substrate WF. That is, the film thickness measuring instrument 600 is allowed to swing above the substrate WF at timings where it does not interfere with the polishing pad 222 swinging above the substrate WF, and can measure the film thickness profile of the substrate WF polished by the polishing pad 222 over time. The film thickness measuring instrument 600 can detect an ending point of the polishing of the substrate WF when the measured film thickness profile of the substrate WF reaches a desired film thickness profile.

<Dresser>

As illustrated in FIG. 1 and FIG. 2, the dresser 500 is arranged on turning paths of the polishing pads 222, 242 by the rotation of the swing shaft 210. Diamond particles or the like are firmly electrodeposited on the surface of the dresser 500. The dresser 500 is a member for dressing the polishing pads 222, 242. The dresser 500 is configured to be rotated by a rotation drive mechanism, such as a motor (not illustrated). Pure water can be supplied to the surface of the dresser 500 from a nozzle (not illustrated). The substrate processing apparatus 1000 rotates the dresser 500 while supplying pure water from the nozzle to the dresser 500, rotates the polishing pads 222, 242, and swings the polishing pads 222, 242 with respect to the dresser 500 while pressing the polishing pads 222, 242 against the dresser 500. Thus, the dresser 500 scrapes off the polishing pads 222, 242 to dress polishing surfaces of the polishing pads 222, 242.

<Pad Holder>

Figure 4:
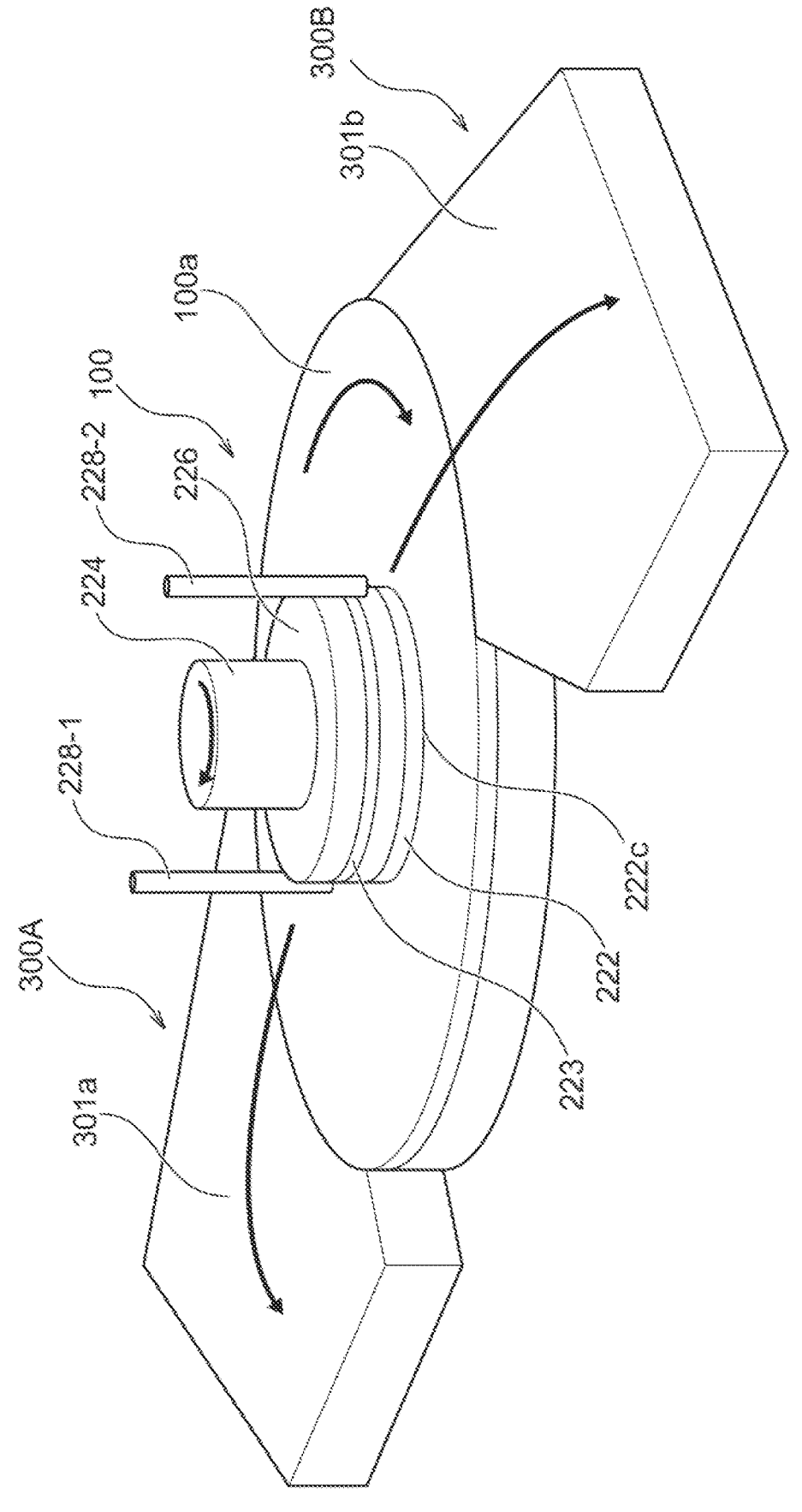
FIG. 4 is a perspective view schematically illustrating a pad holder according to one embodiment.
Figure 5:
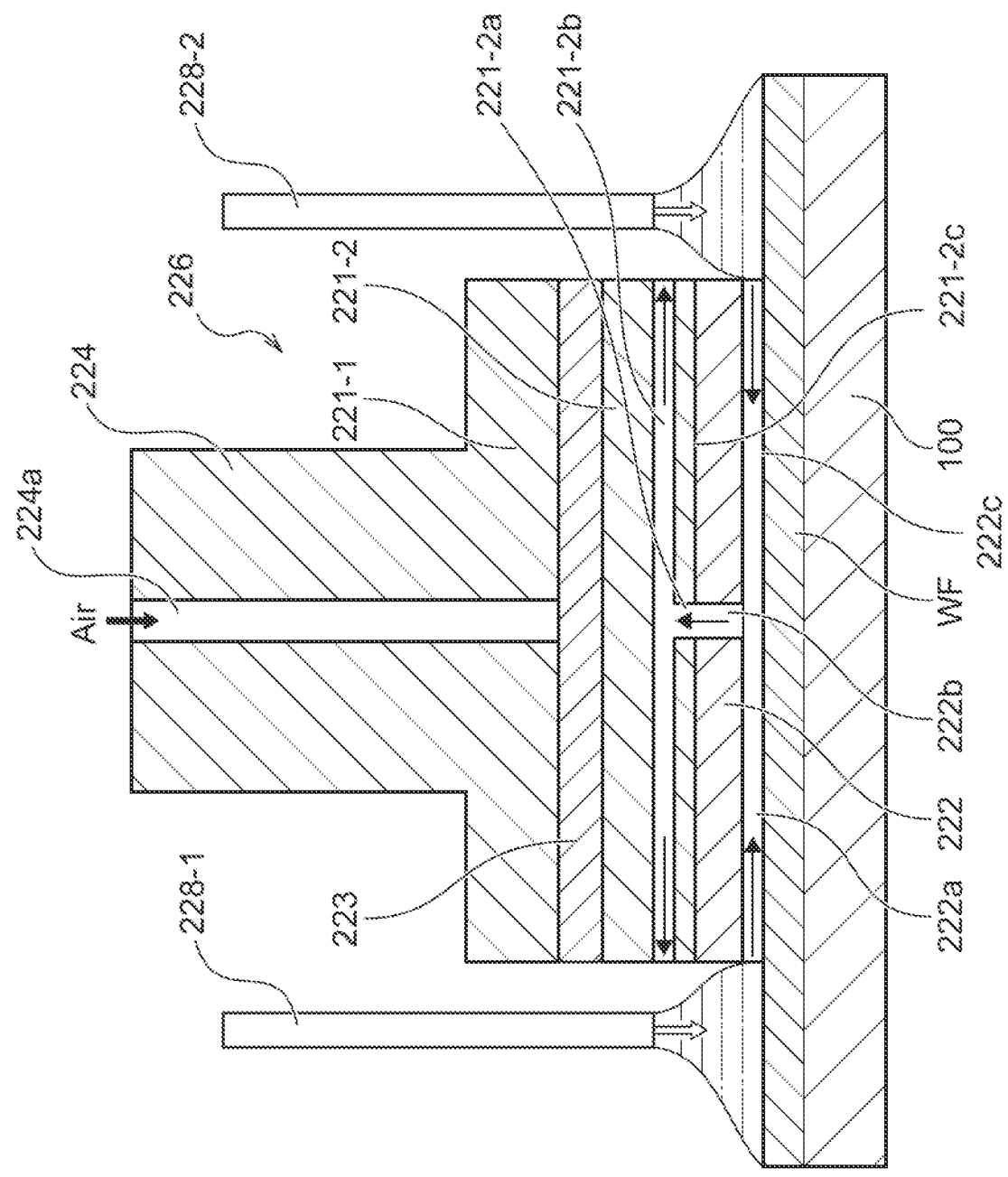
FIG. 5 is a cross-sectional view schematically illustrating the pad holder according to one embodiment.

FIG. 4 is a perspective view schematically illustrating the pad holder according to one embodiment. FIG. 5 is a cross-sectional view schematically illustrating the pad holder according to one embodiment. The configuration of the pad holder 226 will be described below, and the pad holder 246 also has the similar configuration.

As illustrated in FIG. 5, the pad holder 226 includes a plate-shaped first holder main body 221-1 mounted to a lower end of the rotation shaft 224 and a plate-shaped second holder main body 221-2 disposed below the first holder main body 221-1. The pad holder 226 includes an air bag 223 sandwiched between the first holder main body 221-1 and the second holder main body 221-2. A flow passage 224a communicated with the air bag 223 is formed in the rotation shaft 224 and the first holder main body 221-1. The multi-axis arm 200 can adjust the pressing force of the polishing pad 222 against the substrate WF by supplying a gas to the air bag 223 from a fluid source (not illustrated) via the flow passage 224a.

The pad holder 226 (the second holder main body 221-2) has a discharge hole 221-2a formed in the center of a holding surface 221-2c that holds the polishing pad 222 and discharge passages 221-2b communicated with outside of the pad holder 226 from the discharge hole 221-2a. The discharge passages 221-2b are formed in the second holder main body 221-2 so as to communicate the discharge hole 221-2a with a side surface of the second holder main body 221-2.

Figure 6:
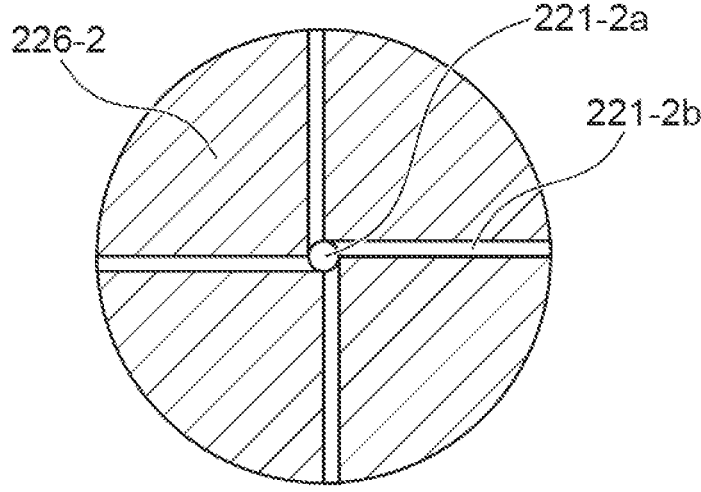
FIG. 6 is a plan view schematically illustrating a second holder main body according to one embodiment.

FIG. 6 is a plan view schematically illustrating the second holder main body 221-2 according to one embodiment. As illustrated in FIG. 6, the discharge passages 221-2b radially extend from the discharge hole 221-2a and open at a plurality of positions (four positions in this embodiment) on the side surface of the second holder main body 221-2. As illustrated in FIG. 6, the discharge hole 221-2a is a circular hole, and the discharge passages 221-2b extend from the discharge hole 221-2a in tangential directions of the discharge hole 221-2a when the second holder main body 221-2 is viewed in plan view, and open at the plurality of positions on the side surface of the second holder main body 221-2. While an example in which the four discharge passages 221-2b are formed has been shown in this embodiment, the number of discharge passages 221-2b may be any number.

Figure 7:
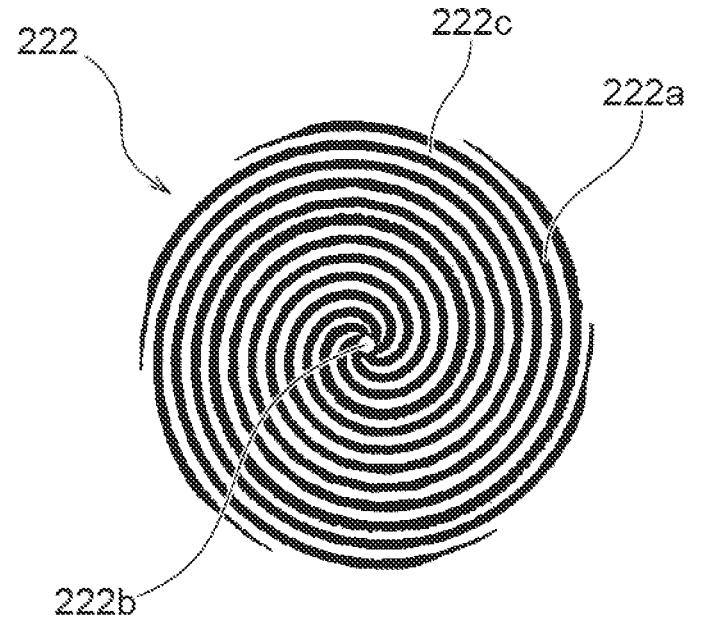
FIG. 7 is a plan view schematically illustrating a polishing pad according to one embodiment.

FIG. 7 is a plan view schematically illustrating the polishing pad according to one embodiment. As illustrated in FIG. 5 and FIG. 7, the polishing pad 222 has a through-hole 222b formed in the center of the polishing surface 222c that contacts the substrate WF. The through-hole 222b is similar in size and shape to the discharge hole 221-2a. The through-hole 222b and the discharge hole 221-2a communicate with one another. A groove 222a that communicates the through-hole 222b with the side surface of the polishing pad 222 is formed on the polishing surface 222c of the polishing pad 222. As illustrated in FIG. 7, the groove 222a includes spiral grooves that communicates the through-hole 222b with the side surface of the polishing pad 222.

The substrate processing apparatus 1000 of this embodiment does not supply the polishing liquid to the substrate WF via the pad holder 226, but supplies the polishing liquid by the nozzles 248 arranged around the pad holder 226. This eliminates the need for disposing a rotary joint, and thus suppresses damage to the surface to be polished of the substrate WF by particles resulting from the abrasion of the components inside the rotary joint entering between the polishing pad 222 and the substrate WF together with the polishing liquid.

Meanwhile, when the polishing liquid is supplied around the pad holder 226, an objective is to sufficiently supply the polishing liquid between the polishing surface of the polishing pad 222 and the surface to be polished of the substrate WF. In this respect, the substrate processing apparatus 1000 of this embodiment can facilitate the transfer of the polishing liquid from the outside of the polishing pad 222 to the center of the polishing pad 222 with the use of the polishing pad 222 on which the spiral groove 222a is formed. Here, simply using the polishing pad 222 on which the spiral groove 222a is formed might cause air to concentrate on the center of the polishing pad 222 and increase the pressure, resulting in an insufficient transfer of the polishing liquid to the center of the polishing pad 222.

In contrast to this, in this embodiment, the through-hole 222b is formed in the center of the polishing pad 222, and the discharge hole 221-2a communicated with the through-hole 222b and the discharge passages 221-2b that communicate the discharge hole 221-2a with the outside of the pad holder 226 are formed in the second holder main body 221-2. This allows the air collected to the center of the polishing pad 222 to be discharged outside the pad holder 226 via the through-hole 222b, the discharge hole 221-2a, and the discharge passages 221-2b. Accordingly, an increase in pressure at the center of the polishing pad 222 can be suppressed, thus allowing the polishing liquid to be smoothly transferred toward the center of the polishing pad 222.

In addition, since the discharge passages 221-2b radially extend from the discharge hole 221-2a and a centrifugal force acts on the discharge passages 221-2b, the polishing liquid transferred to the center of the polishing pad 222 can be discharged outside the pad holder 226 via the through-hole 222b, the discharge hole 221-2a, and the discharge passages 221-2b. Here, in this embodiment, the polishing liquid transferred to the center of the polishing pad 222 by the spiral groove 222a is helically raised through the discharge hole 221-2a. In this respect, as illustrated in FIG. 6, the discharge passages 221-2b radially extend in the tangential directions of the discharge hole 221-2a, and thus the polishing liquid helically raised through the discharge hole 221-2a can easily flow to the discharge passages 221-2b. Discharging the polishing liquid outside the pad holder 226 by the centrifugal force, as described above, allows the polishing liquid supplied around the pad holder 226 to be more smoothly transferred to the center of the polishing pad 222. As a result, the sufficient amount of the polishing liquid can be supplied between the substrate WF and the polishing pad 222, and thus the polishing rate of the substrate WF can improve.

As described above, the substrate processing apparatus 1000 of this embodiment is configured to polish the substrate WF while swinging the pad holder 226 such that the polishing pad 222 is supported by the supporting members 300. The multi-axis arm 200 is configured to supply the polishing liquid from the nozzles 228 not only when the polishing pad 222 is in contact with the substrate WF but also when the polishing pad 222 is in contact with the supporting members 300. Since the polishing liquid supplied from the nozzles 228 when the polishing pad 222 is in contact with the supporting members 300 is transferred to the center of the polishing pad 222 as described above, the polishing pad 222 is filled with the polishing liquid that has not been used for polishing the substrate WF. Accordingly, as soon as the pad holder 226 is swung to bring the polishing pad 222 into contact with the substrate WF, the polishing process of the substrate WF is performed, thus allowing uniform polishing of the surface to be polished of the substrate WF and improving the polishing rate.

In this embodiment, while an example in which the polishing pad 222 having the spiral groove 222a is mounted to the pad holder 226 has been shown, the configuration is not limited to this. The polishing pad 222 may have any configuration insofar as a groove that communicates the through-hole 222*b* at the center of the polishing surface 222*c* with the side surface of the polishing pad 222 is formed on the polishing surface 222*c* to transfer the polishing liquid to the center of the polishing pad 222.

Figure 9:
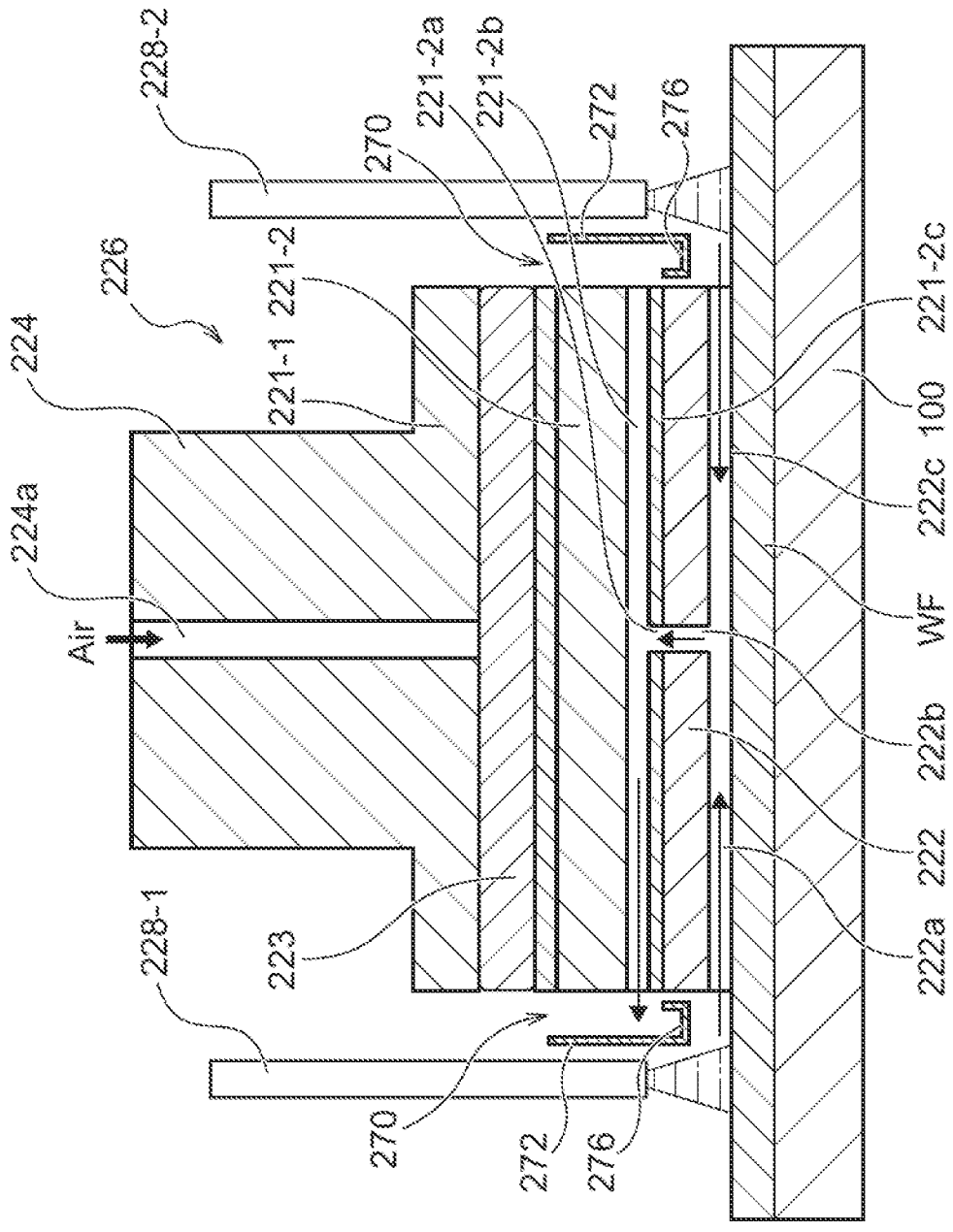
FIG. 9 is a cross-sectional view schematically illustrating the pad holder according to one embodiment.
Figure 10:
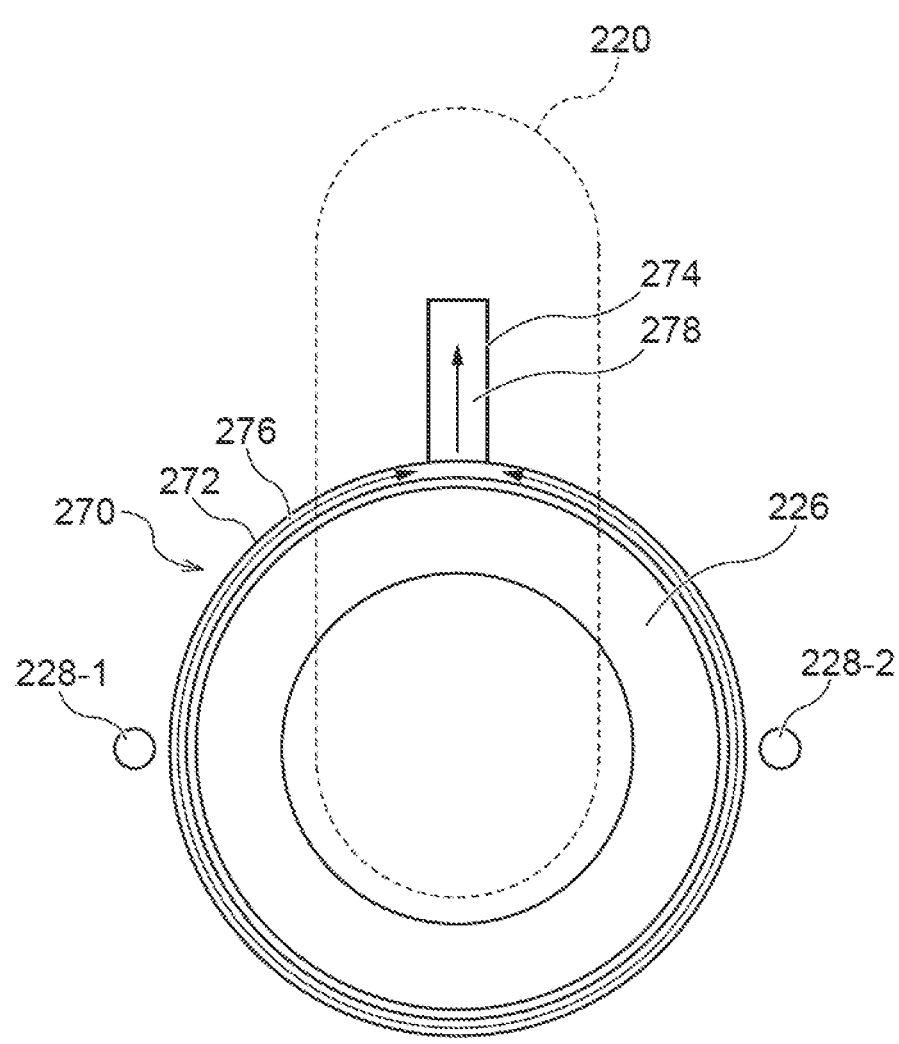
FIG. 10 is a plan view of the pad holder shown in FIG. 9 viewed from above.

FIG. 9 is a cross-sectional view schematically illustrating the pad holder according to one embodiment. FIG. 10 is a plan view of the pad holder shown in FIG. 9 viewed from above. While the configuration of the pad holder 226 according to one embodiment will be described below with reference to FIG. 9 and FIG. 10, the pad holder 246 may have the similar configuration.

The pad holder 226 shown in FIG. 9 includes the structure similar to the pad holder 226 shown in FIG. 5. In the embodiment shown in FIG. 9, the substrate processing apparatus 1000 includes a polishing liquid recovery member 270. The polishing liquid recovery member 270 includes an annular portion 272 arranged so as to surround the second holder main body 221-2 of the pad holder 226 and an extending portion 274 that extends radially outward from the annular portion 272. An annular polishing liquid recovery passage 276 that receives the polishing liquid discharged from the discharge passages 221-2*b* is defined in the annular portion 272. Similarly, a polishing liquid recovery passage 278 is defined in the extending portion 274. The polishing liquid recovery passage 276 of the annular portion 272 communicates with the polishing liquid recovery passage 278, and the polishing liquid discharged from the discharge passages 221-2*b* is recovered through the polishing liquid recovery passage 276 and the polishing liquid recovery passage 278. The recovered polishing liquid is discharged outside the table 100 and discarded together with the polishing liquid flowed down from the table 100. The recovered polishing liquid may be reused after an appropriate treatment such as a removal of residues.

The polishing liquid recovery member 270 is secured to the first arm 220 so as not to contact the pad holder 226. Therefore, the polishing liquid recovery member 270 does not rotate in conjunction with the pad holder 226 but swing with the pad holder 226. However, the annular portion 272 of the polishing liquid recovery member 270 is preferably arranged close to the pad holder 226 in order to efficiently recover the polishing liquid. In a case where the polishing liquid recovery member 270 is disposed around the pad holder 246, the polishing liquid recovery member 270 is secured to the third arm 240.

<Flowchart>

Figure 8:
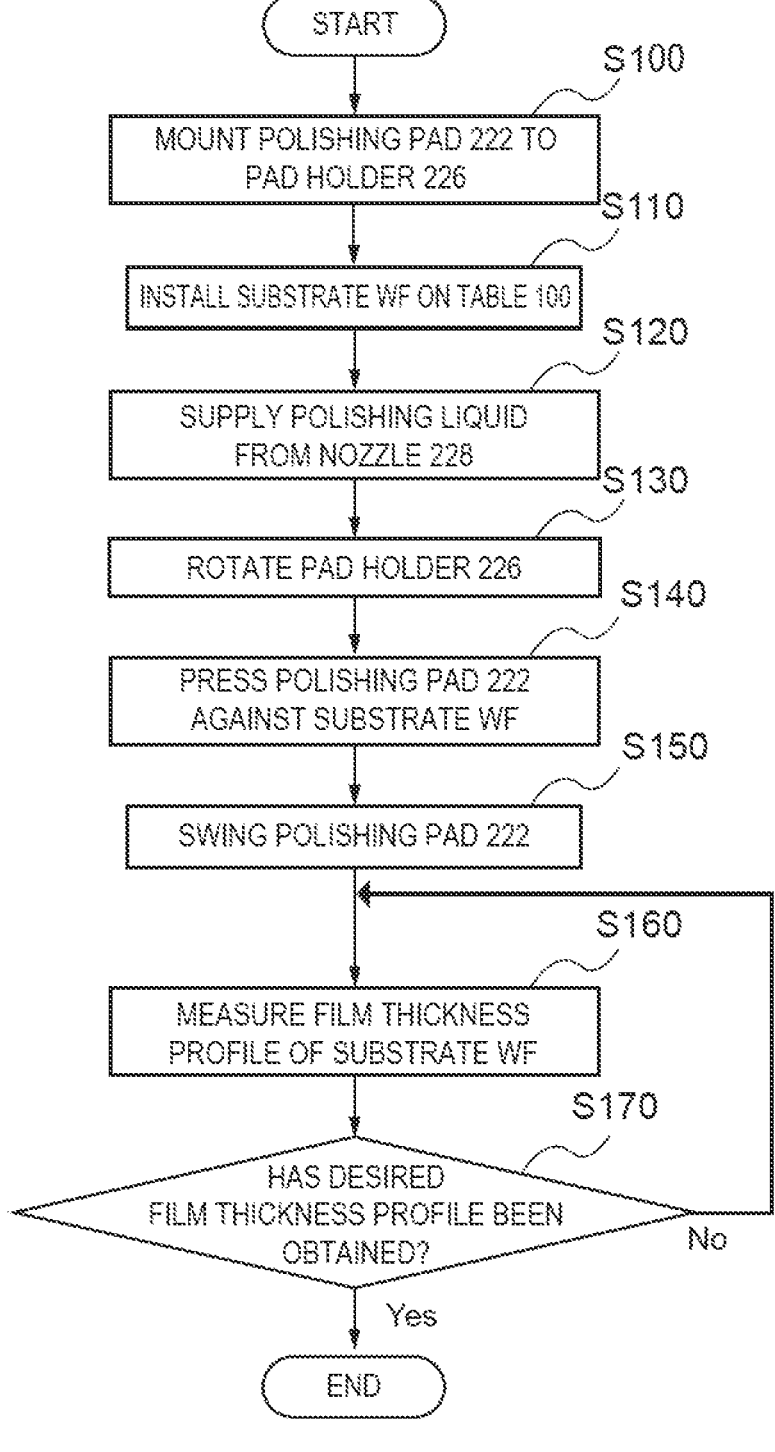
FIG. 8 is a flowchart depicting a substrate processing method according to one embodiment.

Next, a procedure of the substrate processing method according to this embodiment will be described. FIG. 8 is a flowchart depicting the substrate processing method according to one embodiment. As shown in FIG. 8, the substrate processing method first mounts the polishing pad 222 to the pad holder 226 (mounting step S100). The substrate processing method of this embodiment employs, as illustrated in FIG. 7, the polishing pad 222 on which the through-hole 222*b* is formed in the center of the polishing surface 222*c* and the spiral groove 222*a* that communicates the through-hole 222*b* with the side surface of the polishing pad 222 is formed on the polishing surface 222*c*. The substrate processing method of this embodiment employs, as illustrated in FIG. 5, the pad holder 226 on which the discharge hole 221-2*a* is formed in the center of the holding surface 221-2*c* and the discharge passages 221-2*b* that communicate with the outside of the pad holder 226 from the discharge hole 221-2*a* are formed.

Subsequently, the substrate processing method installs the substrate WF on the table 100 (installing step S110). Subsequently, the substrate processing method supplies the polishing liquid toward the surface to be polished of the substrate WF from the nozzles 228 arranged around the pad holder 226 (supplying step S120). In the supplying step S120, the polishing liquid is continuously supplied from the nozzles 228 while the following polishing process is performed. Subsequently, the substrate processing method rotates the pad holder 226 using the pad rotation mechanism 229 (rotating step S130). Subsequently, the substrate processing method rotates the table 100 and presses the polishing pad 222 against the substrate WF using the elevating mechanism 227 and the air bag 223 (pressing step S140).

Subsequently, the substrate processing method swings the pad holder 226 in the radial direction of the substrate using the rotation drive mechanism 212 (swinging step S150). In the swinging step S150, the pad holder 226 is swung between the substrate WF and the supporting members 300. Here, the above-described supplying step S120 is configured to supply the polishing liquid to the swing path of the pad holder 226. The supplying step S120 is configured to supply the polishing liquid to the surface to be polished of the substrate WF when the polishing pad 222 is in contact with the substrate WF, and to supply the polishing liquid to the supporting members 300 when the polishing pad 222 swung outside of the table 100 in the swinging step S150 is supported by the supporting members 300. The polishing process of the substrate WF is performed as described above.

Subsequently, the substrate processing method measures the film thickness profile of the surface to be polished of the substrate WF with the film thickness measuring instrument 600 while polishing the substrate WF (film thickness measuring step S160). Subsequently, the substrate processing method determines whether the film thickness profile measured in the film thickness measuring step S160 is the desired film thickness profile or not (determining step S170). The substrate processing method returns to the film thickness measuring step S160 and repeats the process when it is determined that the desired film thickness profile is not obtained (determining step S170, No). On the other hand, the substrate processing method terminates the polishing process when it is determined that the desired film thickness profile is obtained (determining step S170, Yes).

According to the substrate processing method of this embodiment, the polishing liquid is supplied from the nozzles 248 arranged around the pad holder 226, and thus the need for disposing the rotary joint is eliminated. As a result, this restrains particles resulting from the abrasion of the components inside the rotary joint from entering between the polishing pad 222 and the substrate WF together with the polishing liquid, thus allowing avoiding damage to the surface to be polished of the substrate WF.

According to the substrate processing method of this embodiment, since the polishing pad 222 having the spiral groove 222*a* is used and the pad holder 226 having the discharge hole 221-2*a* and the discharge passages 221-2*b* is used, the gas collected to the center of the polishing pad 222 can be removed to the outside of the pad holder 226. Further, since the polishing liquid transferred to the center of the polishing pad 222 by the spiral groove 222*a* can be discharged from the discharge passages 221-2*b* by the centrifugal force associated with a rotation of the pad holder 226, the polishing liquid can be sequentially transferred to the center of the polishing pad 222. As a result, the sufficient amount of the polishing liquid can be supplied between the substrate WF and the polishing pad 222, and thus the polishing rate of the substrate WF can improve. When the substrate processing apparatus 1000 shown in FIG. 9 and FIG. 10 is used, the polishing liquid discharged from the discharge passages 221-2*b* can be recovered by the polishing liquid recovery member 270. Therefore, it is possible to avoid supplying the polishing liquid that has been used for polishing between the polishing pad 222 and the substrate WF again and polish the substrate WF with the fresh polishing liquid.

While some embodiments of the present invention have been described above, the above-described embodiments of the invention are for ease of understanding the present invention, and are not for limiting the present invention. It is obvious that the present invention can be changed or improved without departing from its gist, and that the present invention encompasses its equivalents. Within a range that can solve at least a part of the above-described problems or a range that provides at least a part of the effects, any combination or omission of each component described in the claim and the description are all owed.

As one embodiment, this application discloses a substrate processing apparatus that includes: a table for supporting a substrate; a pad holder for holding a polishing pad for polishing the substrate supported by the table; a nozzle for supplying a polishing liquid around the pad holder; and a pad rotation mechanism for rotating the pad holder. The pad holder includes: a discharge hole formed in a center of a holding surface configured to hold the polishing pad; and a discharge passage communicated with an outside of the pad holder from the discharge hole.

Furthermore, as one embodiment, this application discloses a substrate processing apparatus in which the discharge passage is formed in the pad holder so as to communicate the discharge hole with a side surface of the pad holder.

Furthermore, as one embodiment, this application discloses a substrate processing apparatus in which the discharge passage is formed in the pad holder so as to extend radially from the discharge hole and open at a plurality of positions on the side surface of the pad holder.

Furthermore, as one embodiment, this application discloses a substrate processing apparatus in which the discharge hole is a circular hole, and the discharge passage is formed in the pad holder so as to extend from the discharge hole in a tangential direction of the discharge hole when the pad holder is viewed in plan view and open at a plurality of positions on the side surface of the pad holder.

Furthermore, as one embodiment, this application discloses a substrate processing apparatus in which the pad holder is configured to hold the polishing pad, the polishing pad having a polishing surface in which a through-hole communicated with the discharge hole is formed, the polishing surface being configured to contact the substrate supported by the table, the polishing pad having a groove formed on the polishing surface, the groove being configured to communicate the through-hole with the side surface of the polishing pad.

Furthermore, as one embodiment, this application discloses a substrate processing apparatus in which the groove includes a spiral groove configured to communicate the through-hole with the side surface of the polishing pad.

Furthermore, as one embodiment, this application discloses a substrate processing apparatus that further includes a swing mechanism for swinging the pad holder in a radial direction of the substrate and a supporting member for supporting the polishing pad swung to an outside of the table by the swing mechanism.

Furthermore, as one embodiment, this application discloses a substrate processing apparatus in which the nozzle includes a first nozzle arranged on a swing path of the pad holder and a second nozzle arranged on a swing path of the pad holder on a side opposite to the first nozzle across the pad holder.

Furthermore, as one embodiment, this application discloses a substrate processing apparatus in which the supporting member includes a first supporting member arranged on a swing path of the pad holder outside the table and a second supporting member arranged on a swing path of the pad holder on a side opposite to the first supporting member across the table.

Furthermore, as one embodiment, this application discloses a substrate processing apparatus that includes a polishing liquid recovery member for recovering the polishing liquid discharged from the discharge passage. The polishing liquid recovery member includes an annular portion arranged so as to surround the pad holder.

Furthermore, as one embodiment, this application discloses a substrate processing method that includes: an installing step of installing a substrate on a table; a supplying step of supplying a polishing liquid from a nozzle arranged around a pad holder to a substrate, the pad holder being for holding a polishing pad, the pad holder including a discharge hole formed in a center of a holding surface for holding the polishing pad and a discharge passage communicated with an outside of the pad holder from the discharge hole; a rotating step of rotating the pad holder; and a pressing step of pressing the polishing pad held onto the pad holder against the substrate.

Furthermore, as one embodiment, this application discloses a substrate processing method that further includes: a mounting step of mounting a polishing pad to the pad holder, the polishing pad having a polishing surface in which a through-hole communicated with the discharge hole is formed, the polishing surface being configured to contact the substrate installed on the table, the polishing pad having a groove formed on the polishing surface, the groove being configured to communicate the through-hole with the side surface of the polishing pad.

Furthermore, as one embodiment, this application discloses a substrate processing method in which the groove includes a spiral groove configured to communicate the through-hole with the side surface of the polishing pad.

Furthermore, as one embodiment, this application discloses a substrate processing method that further includes a swinging step of swinging the polishing pad in a radial direction of the substrate. The supplying step includes a step of supplying the polishing liquid to a swing path of the pad holder.

Furthermore, as one embodiment, this application discloses a substrate processing method in which the supplying step is configured such that the supplying step supplies the polishing liquid when a polishing pad swung to the outside of the table is supported by a supporting member arranged around the table.

Furthermore, as one embodiment, this application discloses a substrate processing method that includes a recovering step of recovering a polishing liquid discharged from the discharge passage by a polishing liquid recovery member, the polishing liquid recovery member including an annular portion arranged so as to surround the pad holder.

REFERENCE SIGNS LIST

100 . . . table
200 . . . multi-axis arm 221-1 . . . first holder main body
221-2 . . . second holder main body
221-2*a* . . . discharge hole
221-2*b* . . . discharge passage
221-2*c* . . . holding surface
222 . . . polishing pad
222*a* . . . spiral groove
222*b* . . . through-hole
222*c* . . . polishing surface
226 . . . pad holder
227 . . . elevating mechanism
228 . . . nozzle
228-1 . . . first nozzle
228-2 . . . second nozzle
229 . . . pad rotation mechanism
270 . . . polishing liquid recovery member
300 . . . supporting member
300A . . . first supporting member
300B . . . second supporting member
301*a*, 301*b* . . . support surface
1000 . . . substrate processing apparatus
WF . . . substrate

What is claimed is:

1. A substrate processing apparatus comprising:
a table for supporting a substrate;
a pad holder for holding a polishing pad for polishing the substrate supported by the table;
a nozzle for supplying a polishing liquid around the pad holder; and
a pad rotation mechanism for rotating the pad holder, wherein
the pad holder includes:
   a discharge hole formed in a center of a holding surface configured to hold the polishing pad, the holding surface being defined at a bottom of the pad holder; and
   a discharge passage communicated with an outside of the pad holder from the discharge hole,
wherein the discharge passage is formed in the pad holder so as to communicate the discharge hole with a side surface of the pad holder.

2. The substrate processing apparatus according to claim 1, wherein
the discharge passage is formed in the pad holder so as to extend radially from the discharge hole and open at a plurality of positions on the side surface of the pad holder.

3. The substrate processing apparatus according to claim 1, wherein
the discharge hole is a circular hole, and the discharge passage is formed in the pad holder so as to extend from the discharge hole in a tangential direction of the discharge hole when the pad holder is viewed in plan view and open at a plurality of positions on the side surface of the pad holder.

4. The substrate processing apparatus according to claim 1, wherein
the pad holder is configured to hold the polishing pad, the polishing pad having a polishing surface in which a through-hole communicated with the discharge hole is formed, the polishing surface being configured to contact the substrate supported by the table, the polishing pad having a groove formed on the polishing surface, the groove being configured to communicate the through-hole with the side surface of the polishing pad.

5. The substrate processing apparatus according to claim 4, wherein
the groove includes a spiral groove configured to communicate the through-hole with the side surface of the polishing pad.

6. The substrate processing apparatus according to claim 1, further comprising:
a swing mechanism for swinging the pad holder in a radial direction of the substrate; and
a supporting member for supporting the polishing pad swung to an outside of the table by the swing mechanism.

7. The substrate processing apparatus according to claim 6, wherein
the nozzle includes a first nozzle arranged on a swing path of the pad holder and a second nozzle arranged on a swing path of the pad holder on a side opposite to the first nozzle across the pad holder.

8. The substrate processing apparatus according to claim 6, wherein
the supporting member includes a first supporting member arranged on a swing path of the pad holder outside the table and a second supporting member arranged on a swing path of the pad holder on a side opposite to the first supporting member across the table.

9. The substrate processing apparatus according to claim 1, comprising
a polishing liquid recovery member for recovering the polishing liquid discharged from the discharge passage, wherein
the polishing liquid recovery member includes an annular portion arranged so as to surround the pad holder.

* * * * *